(12) United States Patent
Han et al.

(10) Patent No.: US 11,984,067 B2
(45) Date of Patent: May 14, 2024

(54) DISPLAY SUBSTRATE, DISPLAY PANEL AND DISPLAY DEVICE

(71) Applicant: BOE Technology Group Co., Ltd., Beijing (CN)

(72) Inventors: Ying Han, Beijing (CN); Yicheng Lin, Beijing (CN); Ling Wang, Beijing (CN); Pan Xu, Beijing (CN); Guoying Wang, Beijing (CN); Xing Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 310 days.

(21) Appl. No.: 17/421,264

(22) PCT Filed: Jan. 11, 2021

(86) PCT No.: PCT/CN2021/071064
§ 371 (c)(1),
(2) Date: Jul. 7, 2021

(87) PCT Pub. No.: WO2021/147696
PCT Pub. Date: Jul. 29, 2021

(65) Prior Publication Data
US 2023/0146528 A1 May 11, 2023

(30) Foreign Application Priority Data
Jan. 22, 2020 (CN) .......................... 202010074996.6

(51) Int. Cl.
*G09G 3/3208* (2016.01)
*H10K 59/65* (2023.01)
*H10K 59/12* (2023.01)

(52) U.S. Cl.
CPC .......... *G09G 3/3208* (2013.01); *H10K 59/65* (2023.02); *G09G 2300/0426* (2013.01);
(Continued)

(58) Field of Classification Search
CPC .......... H10K 59/00–95; G02F 1/13312; G02F 1/13338; G06V 40/1318; G06V 40/13;
(Continued)

(56) References Cited

U.S. PATENT DOCUMENTS 8,860,027 B2 10/2014 Chung et al.
2006/0038758 A1* 2/2006 Routley ............... G09G 3/3233
345/81
(Continued)

FOREIGN PATENT DOCUMENTS

CN 101739954 A 6/2010
CN 108735782 A 11/2018
(Continued)

OTHER PUBLICATIONS

PCT/CN2021/071064 international search report and written opinion.

*Primary Examiner* — Sanjiv D. Patel
(74) *Attorney, Agent, or Firm* — IPro, PLLC (57) ABSTRACT

A display substrate, a display panel, and a display device are provided. The display substrate includes a substrate, a plurality of sub-pixels located on the substrate, a plurality of driving circuits and a plurality of light sensors, an orthographic projection of the light sensors on the substrate is within a range of an orthographic projection of the driving circuits on the substrate.

10 Claims, 5 Drawing Sheets

(52) U.S. Cl.
CPC ... *G09G 2320/02* (2013.01); *G09G 2360/145* (2013.01); *H10K 59/12* (2023.02)

(58) Field of Classification Search
CPC .... G06V 10/14; G06V 10/145; G06V 10/141; G06F 3/0412; G06F 3/0421
See application file for complete search history.

(56) References Cited

U.S. PATENT DOCUMENTS

| | | | |
|---|---|---|---|
| 2010/0007632 A1 | | 1/2010 | Yamazaki |
| 2010/0118002 A1 | | 5/2010 | Yamashita et al. |
| 2010/0123837 A1 | * | 5/2010 | Yamashita ............... H04N 5/70 348/800 |

FOREIGN PATENT DOCUMENTS

| | | | | | |
|---|---|---|---|---|---|
| CN | 110556408 | A | | 12/2019 | |
| CN | 110634890 | A | | 12/2019 | |
| CN | 111025722 | A | * | 4/2020 | ........... G02F 1/1333 |
| CN | 111261683 | A | | 6/2020 | |

* cited by examiner

DISPLAY SUBSTRATE, DISPLAY PANEL AND DISPLAY DEVICE

CROSS-REFERENCE TO RELATED APPLICATIONS

The present application is the U.S. national phase of PCT Application PCT/CN2021/071064 filed on Jan. 11, 2021, which claims priority to Chinese Patent Application No. 202010074996.6 filed in China on Jan. 22, 2020, which is incorporated herein by reference in its entirety.

TECHNICAL FIELD

The present disclosure relates to the technical field of display, in particular to a display substrate, a display panel and a display device.

BACKGROUND

Some display panels need to be provided with a light sensor, for example, a light sensor for detecting the display brightness of a display panel may be provided, and these light sensors may occupy an opening area of the display panel, which may cause decrease of the opening area of the display panel, accordingly may cause decrease of the resolution of the display panel and may affect the display effect.

SUMMARY

Embodiments of the present disclosure provide a display substrate, a display panel, and a display device to solve the problem that a light sensor may cause a decrease of resolution of the display panel, affecting the display effect.

In a first aspect, the embodiments of the present disclosure provide a display substrate, including a substrate, a plurality of sub-pixels located on the substrate, a plurality of driving circuits and a plurality of light sensors. An orthographic projection of the light sensor on the substrate is within the range of the orthographic projection of the driving circuit on the substrate.

Optionally, a detection range of each of the light sensors corresponds to a plurality of the sub-pixels, and the light sensors are configured to detect the brightness of the corresponding sub-pixels.

Optionally, an orthographic projection of each of the light sensors on the substrate is within a range of an orthographic projection of the driving circuit of the plurality of sub-pixels corresponding to the light sensors on the substrate.

Optionally, the plurality of sub-pixels corresponding to each of the light sensors are respectively arranged on two opposite sides of the light sensor in a first direction parallel to the substrate.

Optionally, the plurality of light sensors includes a first light sensor and a second light sensor, and the driving circuit includes a first driving circuit and a second driving circuit;

the first driving circuit is configured to drive a first sub-pixel group of the plurality of sub-pixels, and the second driving circuit is configured to drive a second sub-pixel group of the plurality of sub-pixels except the first sub-pixel group; the first light sensor is configured to detect the brightness of the first sub-pixel group, and the second light sensor is configured to detect the brightness of the second sub-pixel group;

the orthographic projection of the first light sensor on the substrate is within the range of the orthographic projection of the first driving circuit on the substrate, the orthographic projection of the second light sensor on the substrate is within the range of the orthographic projection of the second driving circuit on the substrate.

Optionally, the first light sensor, the first sub-pixel group, the second light sensor, and the second sub-pixel group are arranged sequentially along the first direction.

Optionally, in the first direction, the first sub-pixel group is located between the first light sensor and the second light sensor, the second sub-pixel group is located on a side, away from the first sub-pixel group, of the second light sensor, the second light sensor is located between the first sub-pixel group and the second sub-pixel group.

Optionally, the plurality of sub-pixels in the first sub-pixel group are arranged in a second direction, and the plurality of sub-pixels in the second sub-pixel group are arranged in the second direction, wherein the second direction is parallel to the substrate and perpendicular to the first direction.

Optionally, the light sensor is electrically connected to the driving circuit via a via-hole on the display substrate, the orthographic projection of the via-hole opened on the substrate is within the range of the orthographic projection of the driving circuit on the substrate.

Optionally, the orthographic projection of the via-hole on the substrate is within the range of the orthographic projection of the light sensors on the substrate.

Optionally, the sub-pixels of different colors are made by a single patterning process.

In a second aspect, embodiments of the present disclosure also provide a display panel including a display substrate as described in any of the above.

In a third aspect, embodiments of the present disclosure also provide a display device including a display panel as described above.

BRIEF DESCRIPTION OF THE DRAWINGS

In order that the manner in which the embodiments of the present disclosure are recited in detail, a brief description of the drawings that accompany the detailed description of the embodiments of the present disclosure is provided below. It is to be understood that the appended drawings are illustrative of only some embodiments of the present disclosure. For a person of ordinary skill in the art, other figures can also be obtained according to these figures without involving any inventive effort.

DETAILED DESCRIPTION

The technical solution of embodiments of the present disclosure will now be described more fully hereinafter with reference to the accompanying drawings, in which some, but not all embodiments of the disclosure are shown. Based on the embodiments of the present disclosure, all other embodiments obtained by a person of ordinary skill in the art without inventive effort fall within the scope of protection of this disclosure.

Embodiments of the present disclosure provide a display substrate.

Figure 1:
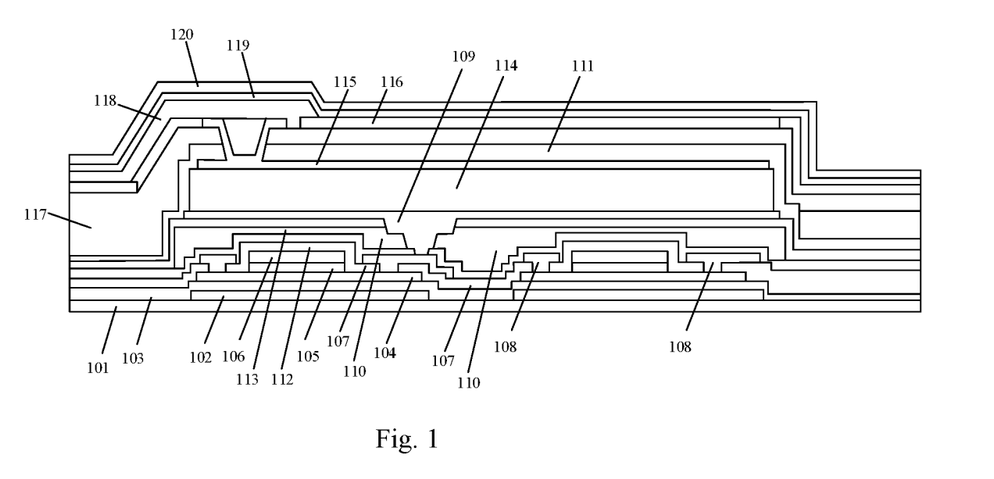
FIG. 1 is a schematic structural diagram of a display substrate provided by embodiments of the present disclosure.
Figure 3A:
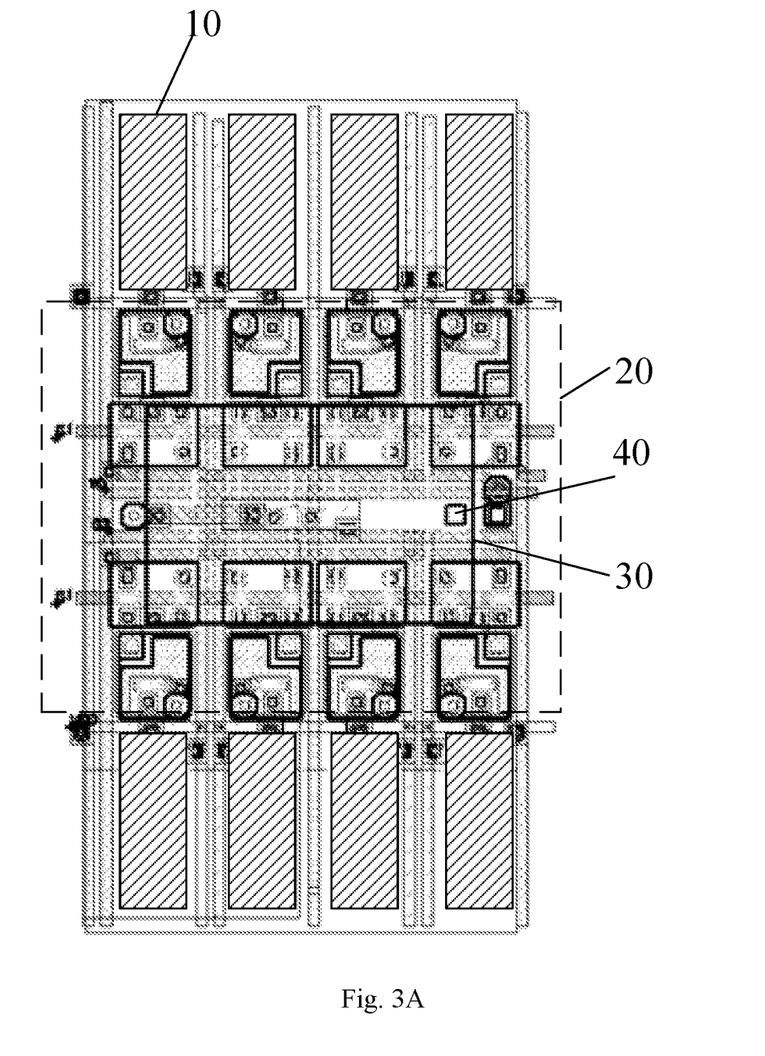
FIG. 3A is another schematic structural diagram of a display substrate provided by an embodiment of the present disclosure.
Figure 3B:
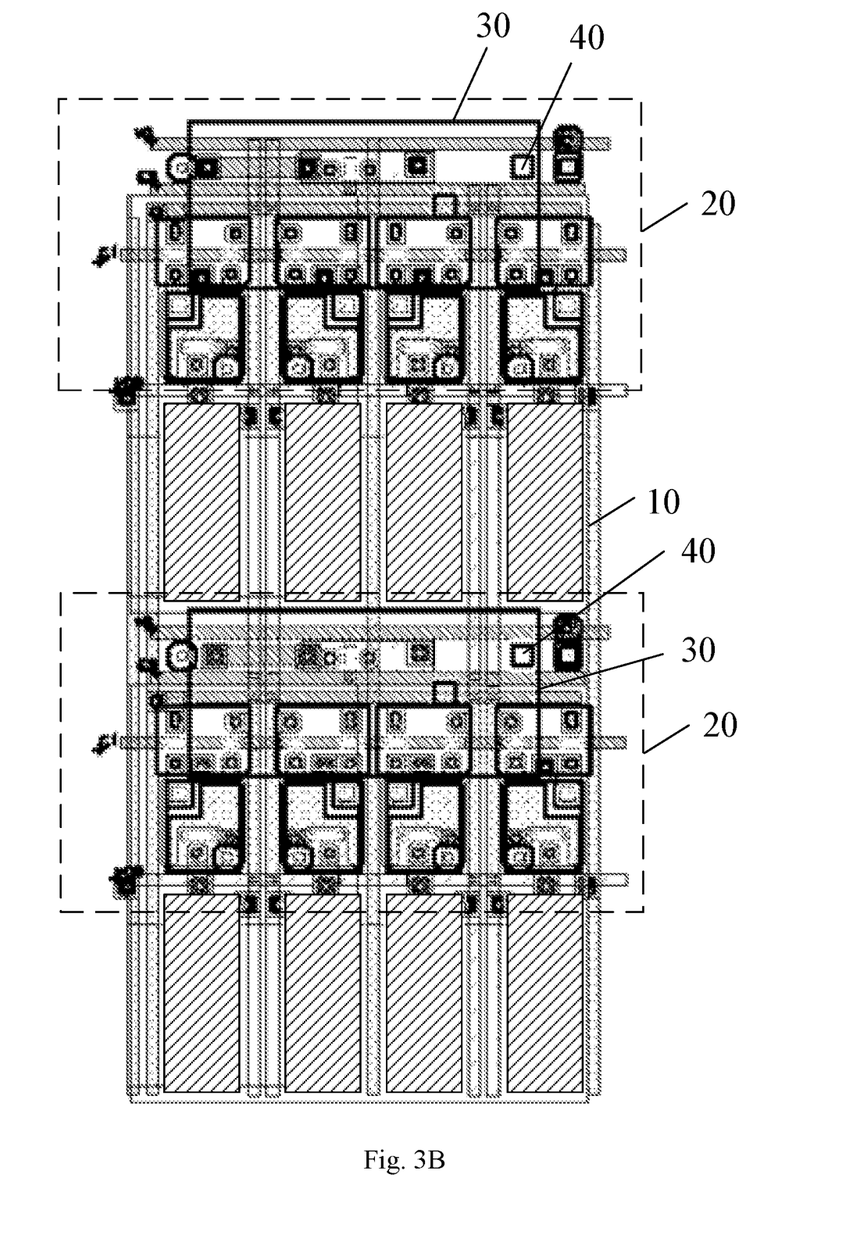
FIG. 3B is another schematic structural diagram of a display substrate provided by an embodiment of the present disclosure.

In one embodiment of the present disclosure, as shown in FIGS. 1, 3A and 3B, the display substrate includes a substrate, a plurality of sub-pixels 10 located on the substrate, a driving circuit 20 and a plurality of light sensors 30.

The light sensors 30 in the present embodiment are configured to detect the intensity of light, and specifically, for example, may be configured to detect the display brightness of the sub-pixels 10 and perform brightness compensation on the display brightness of the sub-pixels 10 according to a detection result, and may also be used as a scene such as fingerprint recognition. Structures of the light sensors 30 can be referred to the related art, and their specific structure are not limited in this embodiment.

The driving circuit 20 refers to various circuit structures on the display substrate, may refer to, for example, a transistor that controls the sub-pixels 10, and specifically may be a thin film transistor (TFT), etc. or a thin film transistor that controls the light sensors 30, etc. These driving circuits 20 occupy a certain opening area.

A bottom-emitting display substrate is further described in this embodiment.

As shown in FIG. 1, the display substrate in one embodiment includes a substrate 101, a shield 102, a buffer 103 and an active 104, a gate insulation layer (GI) 105, a gate layer (Gate) 106, a dielectric layer (ILD) 107, a first source-drain electrode structure (SD1) 108, a second source-drain electrode structure (SD2) 109, an organic insulation layer (sog) 110, a first passivation layer (PVX1) 111, a second passivation layer (PVX2) 112, a third passivation layer (PVX3) 113, a PIN type photodiode 114 used as the light sensors 30, a first transparent electrode layer (ITO1) 115, A second transparent electrode layer (ITO2) 116, a filling structure (RESIN) 117, a pixel definition layer (PDL) 118, an electroluminescent layer (EL) 119 and a third electrode layer 120, which are arranged on the substrate.

It is to be understood that adaptive adjustment can be made to the structure of the display substrate in this embodiment, and the structure of the display substrate is not further limited in this embodiment.

Figure 2A:
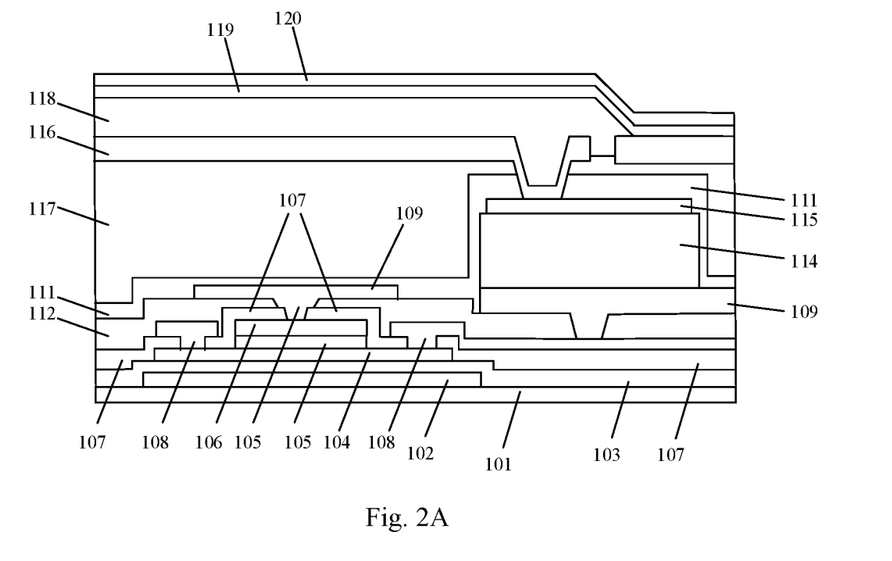
FIG. 2A is a schematic structural diagram of a display substrate in the related art.
Figure 2B:
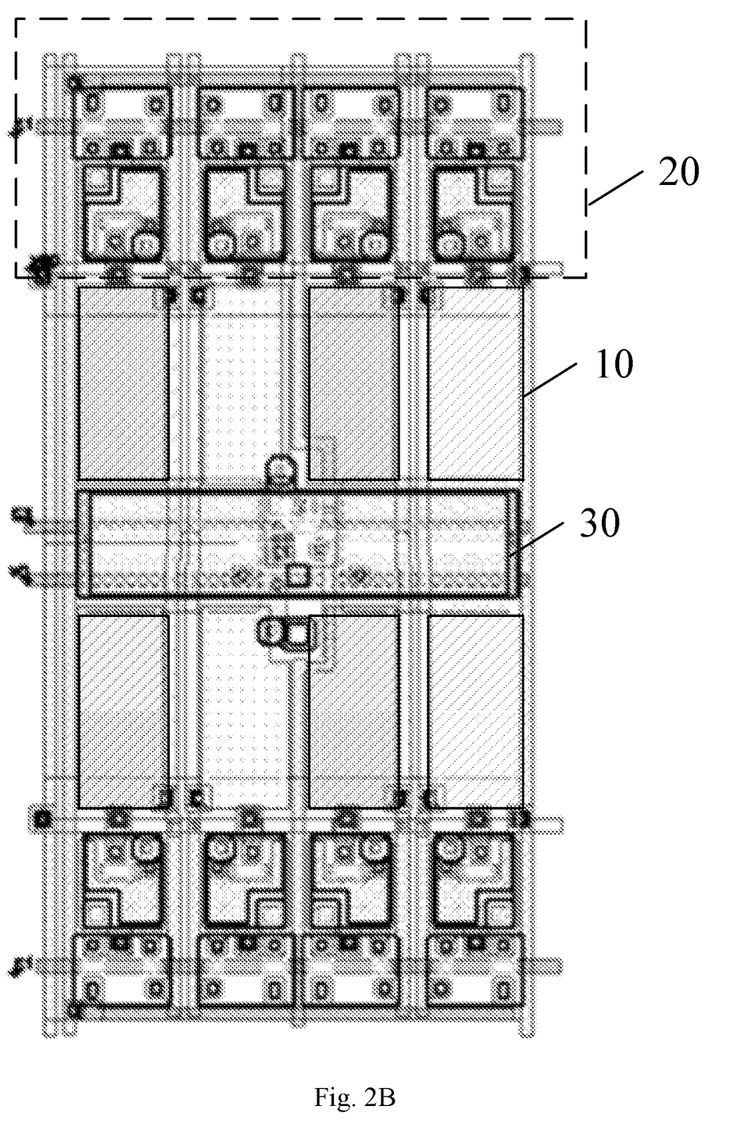
FIG. 2B is another schematic structural diagram of a display substrate in the related art.

Referring to FIGS. 2A and 2B, a display substrate in the related art is shown in FIGS. 2A and 2B. As shown in FIGS. 2A and 2B, the PIN type photodiode 114 used as the light sensors 20 and the driving circuit 20 are arranged in a staggered way, so that a large opening area is occupied.

Since the driving circuit 20 is located in an area outside the opening area, the orthographic projection of the light sensors 30 on the substrate is located within the range of the orthographic projection of the driving circuit 20 on the substrate by adjusting the position of the light sensors 30, which can reduce the occupation of the opening area of the display panel and help to improve the resolution of the display panel.

Thus, according to the technical solution of the embodiment of the present disclosure, the orthographic projection of the light sensors 30 on the substrate is controlled to be within the range of the orthographic projection of the driving circuit 20 on the substrate, which can reduce the occupation of the opening area of the pixel, help to save the pixel space, improve the resolution of the display panel, and then contribute to improving a display effect of the display panel.

Optionally, the detection range of each light sensor 30 corresponds to a plurality of sub-pixels 10, and is configured to detect the brightness of the corresponding sub-pixel 10.

It should be understood that the larger the area of the light sensors 30, the higher the signal-to-noise ratio of a detection result of the light sensors 30 and the higher the detection accuracy of the light sensors 30. In this embodiment, the brightness of the plurality of sub-pixels 10 is detected by using one light sensor 30. With respect to providing a larger number of sensors, it is possible to reduce the required driving circuit 20 and actually increase the detection area of the light sensors 30, which is advantageous for improving the accuracy of the detection result.

More specifically, the orthographic projection of the light sensors 30 onto the substrate is within the range of the orthographic projection of the driving circuit 20 of the plurality of sub-pixels 10 corresponding to the light sensors 30 onto the substrate.

Optionally, the plurality of sub-pixels 10 corresponding to the light sensors 30 are respectively arranged on two opposite sides of the light sensors 30, in a first direction parallel to the substrate.

As shown in FIG. 3A, taking eight sub-pixels 10 corresponding to each light sensor 30 as an example, four sub-pixels 10 are arranged on each side of the light sensor 30, so that the light sensor 30 actually occupies an area corresponding to the driving circuit 20 of the eight sub-pixels 10. This makes space more available.

Optionally, in a direction parallel to the substrate, the plurality of sub-pixels 10 corresponding to the same light sensor 30 are arranged on the same side of the light sensor 30, and the light sensor 30 and a sub-pixel group 10 corresponding to the same light sensor 30 are arranged at intervals in sequence.

As shown in FIG. 3B, taking four sub-pixels 10 corresponding to each light sensor 30 as an example to explain, the four sub-pixels 10 are in a group and all are arranged on the same side of the light sensor 30, and each sub-pixel group 10 and the light sensor 30 are arranged on the display substrate at intervals in sequence in the form of a sub-pixel group 10, a light sensor 30, a sub-pixel group 10, a light sensor 30, etc., so that local sub-pixels 10 can be avoided to be too concentrated, and thus the distribution of the sub-pixels 10 can be more dispersed, which helps to improve the uniformity of display.

Figure 3C:
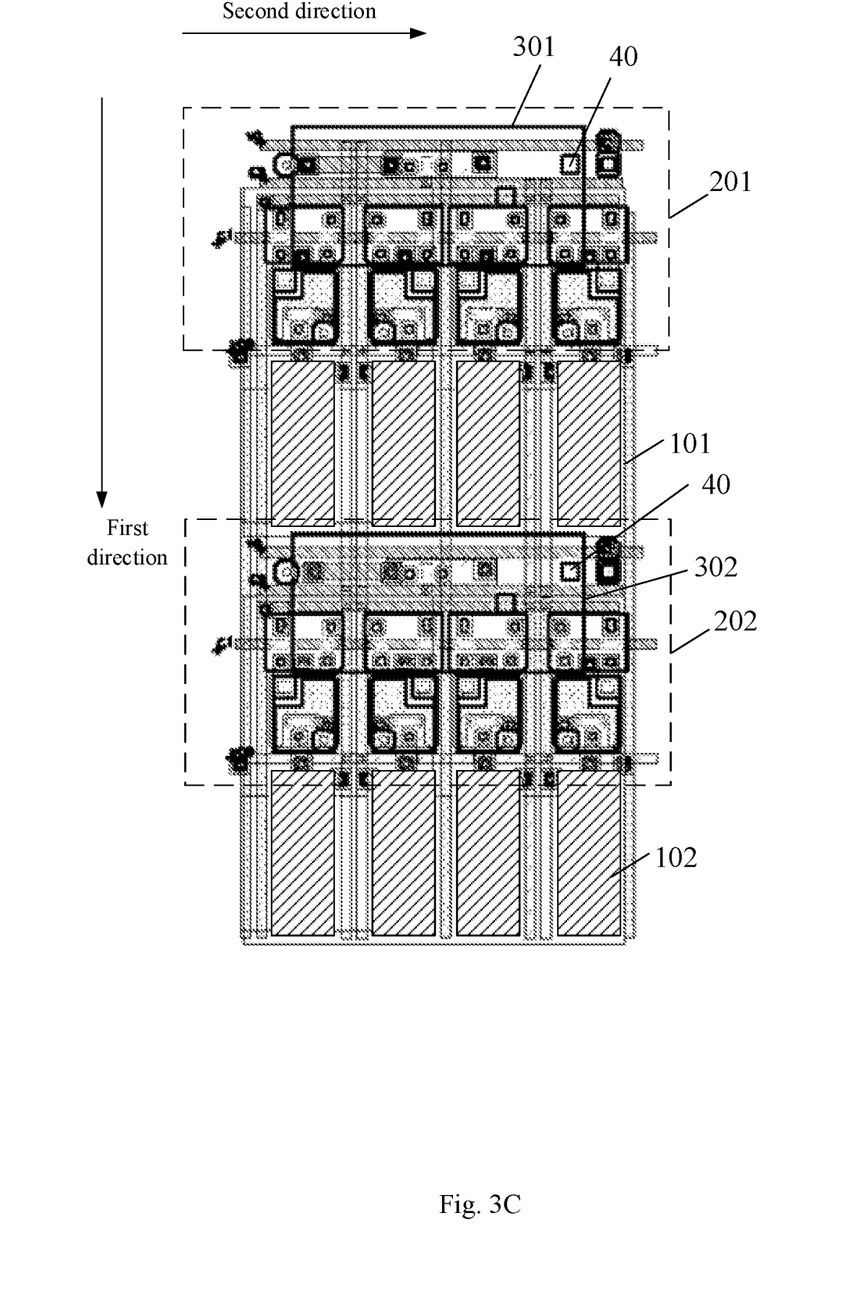
FIG. 3C is another schematic structural diagram of a display substrate provided by an embodiment of the present disclosure.

Specifically, as shown in FIG. 3C, the plurality of light sensors 30 include a first light sensor 301 and a second light sensor 302, and the driving circuit 20 includes a first driving circuit 201 and a second driving circuit 202.

The first driving circuit 201 is configured to drive a first sub-pixel group 101 of the plurality of sub-pixels, and the second driving circuit 202 is configured to drive a second sub-pixel group 102 of the plurality of sub-pixels except the first sub-pixel group 101; the first light sensor 301 is arranged to detect the brightness of the first sub-pixel group 101 and the second light sensor 302 is arranged to detect the brightness of the second sub-pixel group 102.

The orthographic projection of the first light sensor 301 on the substrate is within the range of the orthographic projection of the first driving circuit 201 on the substrate, the orthographic projection of the second light sensor 302 onto the substrate is within the range of the orthographic projection of the second driving circuit 202 onto the substrate.

In the first direction, the first light sensor 301, the first sub-pixel group 101, the second light sensor 302, and the second sub-pixel group 102 are sequentially arranged.

In the first direction, the first sub-pixel group 101 is located between the first light sensor 301 and the second light sensor 302, and the second sub-pixel group 102 is located on a side, away from the first sub-pixel group 101, of the second light sensor 302, the second light sensor 302 is located between the first sub-pixel group 101 and the second sub-pixel group 102.

The plurality of sub-pixels in the first sub-pixel group 101 are arranged along a second direction, and the plurality of sub-pixels in the second sub-pixel group 102 are arranged along the second direction, wherein the second direction is parallel to the substrate and perpendicular to the first direction.

Optionally, the light sensor 30 is electrically connected to the driving circuit 20 through a via-hole 40 opened on the display substrate, the orthographic projection of the via-hole 40 on the substrate is within the range of the orthographic projection of the driving circuit 20 on the substrate.

As shown in FIG. 2B, in the related art, in order to electrically connect the light sensors 30 to the driving circuit 20, a connection line needs to occupy a certain space, and in this embodiment, since the orthographic projection of the light sensors 30 onto the substrate is within the range of the orthographic projection of the driving circuit 20 onto the substrate, the via-hole 40 can be placed within a corresponding range of the driving circuit 20, which helps to save space. Further, the orthographic projection of the via-hole 40 onto the substrate is within the range of the orthographic projection of the light sensors 30 onto the substrate, which can further facilitate the electrical connection of the light sensors 30.

Further, sub-pixels 10 of different colors are manufactured by a single patterning process.

As shown in FIG. 3A and FIG. 3B, it should be understood that the structure of each sub-pixel 10 is quite different because the connection line between the light sensors 30 and the driving circuit 20 occupies a certain space in a design scheme of the related art. Therefore, sub-pixels 10 of different colors need to be made respectively, for example, for a display substrate including sub-pixels 10 of three colors of RGB (red, green and blue), sub-pixels 10 of different colors need to be made through three times of mask process (mask exposure process); however, in the technical solution of the present embodiment, since the wiring via-hole 40 is located in the range of the orthographic projection of the driving circuit 20 on the substrate, the structure of each sub-pixel 10 is not affected by the connection line between the light sensors 30 and the driving circuit 20; therefore, fabrication of the three color sub-pixels 10 can be accomplished by a single patterning process, which helps to save process steps and costs.

After testing, the resolution of a display panel is about 94 PPI (the number of pixels per inch, or called pixel density). After the light sensors 30 are added, because the light sensors 30 need to occupy a certain opening area, based on the design method in the related art, the resolution of the display panel is about 80 PPI, and after the technical solution proposed in the present application is adopted, the resolution of display panel is about 88 PPI, which can effectively improve the resolution of a display panel with respect to the related art.

At the same time, in the design scheme of the related art, the area of the light sensor 30 corresponding to each sub-pixel 10 is about 1300 square microns, and after the technical solution proposed in the present application is adopted, the area of the light sensor 30 corresponding to each sub-pixel 10 is increased to 2100 square microns, and the area of the light sensor 30 corresponding to each sub-pixel 10 is increased, which helps to improve the signal-to-noise ratio of a signal collected by the light sensors 30.

Embodiments of the present disclosure also provide a display panel and a display device, wherein the display panel includes a display substrate as described in any of the above, and the display device includes the display panel.

Since the technical solution of the present embodiment includes all the technical solutions of the above-mentioned display substrate embodiments, at least all the above-mentioned technical effects can be achieved, and description thereof will not be repeated here.

The above embodiments are merely specific implementation modes of the present disclosure, but the scope of protection of the present disclosure is not limited thereto, and any modification and substitution being apparent to those skilled in the art without departing from the technical scope of the present disclosure shall covered by the scope protection of the present disclosure. Accordingly, the scope of protection of the present disclosure is as set forth in the claims.

What is claimed is:

1. A display substrate, comprising a substrate, a plurality of sub-pixels located on the substrate, a plurality of driving circuits and a plurality of light sensors, wherein an orthographic projection of the light sensors on the substrate is located within an orthographic projection of the driving circuit on the substrate;

wherein a detection range of each of the light sensors corresponds to the plurality of the sub-pixels, and the light sensors are configured to detect brightness of the corresponding sub-pixels;

wherein the orthographic projection of each of the light sensors on the substrate is located within the orthographic projection of driving circuit of the plurality of the sub-pixels corresponding to the light sensors on the substrate.

2. The display substrate according to claim 1, wherein the plurality of sub-pixels corresponding to each of the light sensors are respectively arranged on two opposite sides of the light sensors in a first direction parallel to the substrate.

3. The display substrate according to claim 1, wherein the plurality of light sensors comprises a first light sensor and a second light sensor, and the driving circuit comprises a first driving circuit and a second driving circuit;

the first driving circuit is configured to drive a first sub-pixel group of the plurality of sub-pixels, and the second driving circuit is configured to drive a second sub-pixel group of the plurality of sub-pixels except the first sub-pixel group; the first light sensor is configured to detect the brightness of the first sub-pixel group, and the second light sensor is configured to detect the brightness of the second sub-pixel group; and the orthographic projection of the first light sensor on the substrate is within the range of the orthographic projection of the first driving circuit on the substrate, the orthographic projection of the second light sensor on the substrate is within the range of the orthographic projection of the second driving circuit on the substrate.

4. The display substrate according to claim 3, wherein the first light sensor, the first sub-pixel group, the second light sensor, and the second sub-pixel group are sequentially arranged along a first direction.

5. The display substrate according to claim 3, wherein along a first direction, the first sub-pixel group is located between the first light sensor and the second light sensor, and the second sub-pixel group is located on a side, away from the first sub-pixel group, of the second light sensor, the second light sensor is located between the first sub-pixel group and the second sub-pixel group.

6. The display substrate according to claim 3, wherein a plurality of sub-pixels in the first sub-pixel group are arranged in a second direction, a plurality of sub-pixels in the second sub-pixel group are arranged in the second direction, and the second direction is parallel to the substrate and perpendicular to a first direction.

7. The display substrate according to claim 1, wherein the light sensors are electrically connected to the driving circuit through a via-hole opened on the display substrate, the orthographic projection of the via-hole on the substrate is within the range of the orthographic projection of the driving circuit on the substrate.

8. The display substrate of claim 7, wherein the orthographic projection of the via-hole on the substrate is within the range of the orthographic projection of the light sensors on the substrate.

9. A display panel comprising the display substrate of claim 1.

10. A display device comprising the display panel of claim 9.

* * * * *